United States Patent [19]

van den Elshout et al.

[11] Patent Number: 5,053,648

[45] Date of Patent: Oct. 1, 1991

[54] MASTER SLICE CMOS ARRAY HAVING COMPLEMENTARY COLUMNS

[75] Inventors: Andreas A. J. M. van den Elshout; Hendrikus J. M. Veendrick; Dirk W. Harberts, all of Eindhoven, Netherlands

[73] Assignee: U.S. Philips Corporation, New York, N.Y.

[21] Appl. No.: 521,764

[22] Filed: May 10, 1990

[30] Foreign Application Priority Data

Nov. 15, 1989 [NL] Netherlands ............... 8902820

[51] Int. Cl.$^5$ ............................................. H03K 19/177
[52] U.S. Cl. .................................. 307/469; 307/465; 307/481; 365/104
[58] Field of Search ............... 307/452, 465, 468–469, 307/481; 365/104, 230.03

[56] References Cited

U.S. PATENT DOCUMENTS

| | | | |
|---|---|---|---|
| 4,032,894 | 6/1977 | Williams | 307/468 X |
| 4,069,426 | 1/1978 | Hirasawa | 307/469 |
| 4,287,571 | 9/1981 | Chakravarti et al. | 365/104 |
| 4,426,686 | 1/1984 | Yamamoto et al. | 365/104 |
| 4,485,460 | 11/1984 | Stambaugh | 365/104 X |
| 4,506,341 | 3/1985 | Kalter et al. | 307/465 X |
| 4,740,721 | 4/1988 | Chung et al. | 307/469 X |
| 4,773,047 | 9/1988 | Uchino et al. | 365/104 X |
| 4,899,308 | 2/1990 | Khan | 365/104 |

FOREIGN PATENT DOCUMENTS

53-75832 5/1978 Japan ........................... 307/469

OTHER PUBLICATIONS

"Dense ROM Architecture for CMOS Gate Arrays", *IBM T.D.B.*, vol. 31, No. 1, Jun. 1988, pp. 125–126.
Kelly et al., "Dual-Gate Programmable Logic Array", *I.B.M. T.D.B.*, vol. 17, No. 10, Mar. 1975, pp. 2957–2958.

*Primary Examiner*—David Hudspeth
*Attorney, Agent, or Firm*—Bernard Franzblau

[57] ABSTRACT

A master slice semiconductor integrated circuit comprising ROM memory cells which consist of NMOS-transistors as well as PMOS-transistors. In order to increase the integration density on the master slice, the NMOS-transistors and the PMOS-transistors (memory cells) in one and the same row are controlled via one and the same word line. The circuit includes row selection means, for example, an exclusive-OR circuit for each row, for selecting either a single row of NMOS cells or a single row of PMOS cells.

9 Claims, 1 Drawing Sheet

MASTER SLICE CMOS ARRAY HAVING COMPLEMENTARY COLUMNS

BACKGROUND OF THE INVENTION

This invention relates to an integrated semiconductor circuit of the master slice (gate array) type comprising memory cells which are arranged in rows and columns and which are of the read-only type. The memory cells are subdivided into a first and a second group, which first and second group comprise transistors of a first and a second conductivity type, respectively, said semiconductor circuit comprising column selection means for selecting, in response to a column selection signal, an output of either the first or the second group.

An integrated semiconductor circuit of this kind is known from IEEE Journal of Solid-State Circuits, Vol. SC-20, No. 5, October 1985, pp. 1012–1017 "A 240K Transistor CMOS Array with flexible allocation of memory and channels" by Hiromasa Takahashi et al, notably from FIG. 15. The cited article describes a circuit of the gate array type which is also referred to as master slice type. Generally, an integrated semiconductor circuit of the master slice type comprises a plurality of columns of basic cells which are arranged one against the other, connection channels being present between the columns on a central portion of the semiconductor circuit. Since recently integrated semiconductor circuits of the master slice type are available with a so-called "sea of gates" (also referred to as "channel-less gate array" or "high density gate array"); for example, see the article "The CMOS Gate Forest: An Efficient and Flexible High-Performance ASIC Design Environment" by M. Beunder et al. in IEEE Journal of Solid-State Circuits, Vol. 23, No. 2, April 1988, pp. 387–399 where the basic cells are present in the central portion of the semiconductor circuit and the connection channels are formed across the basic cells. An integrated semiconductor circuit of the master slice type with the "sea of gates" permits the integration of a large number of cells because the connection channels occupy little or no additional space. The cited publication by Takahashi describes (see notably FIG. 15) a ROM realised in a high density gate array. Said circuit comprises a first group of n-channel memory cells and a second group of p-channel memory cells. Either the n-channel memory cells or the p-channel memory cells are selected by means of a column decoder.

SUMMARY OF THE INVENTION

It is inter alia an object of the present invention to provide an integrated semiconductor circuit of the master slice type in which the integration density of cells on the semiconductor circuit, and hence the effective use of the semiconductor surface, is higher.

To achieve this, an integrated semiconductor circuit in accordance with the invention is characterized in that inputs of the first and the second group of memory cells in one and the same row are interconnected for the reception of a common row selection signal, there being provided row selection means for selecting a single row of memory cells of either the first or the second group of memory cells. Because the inputs of the first and the second group of memory cells are interconnected, a single word line suffices for the control of the first and the second group of memory cells situated in one and the same row. Consequently, as opposed to the circuit disclosed in the cited publication by Takahashi, in which separate word lines are required for controlling the first and the second group of memory cells within one and the same row, less semiconductor surface is required for control of the memory cells. The integration density of cells on the semiconductor surface, therefore, is increased. Because of the presence of said row selection means in accordance with the invention and the presence of column selection means, a single memory cell can be selected from the first group as well as from the second group of memory cells.

An embodiment of an integrated semiconductor circuit in accordance with the invention is characterized in that for each row the row selection means comprise an inverter and a switching element for presenting either an inverted or a non-inverted common row selection signal in dependence on an address signal. A memory cell can thus be simply selected in the first group or in the second group.

Another embodiment of an integrated semiconductor circuit in accordance with the invention is characterized in that the inverter and the switching element in a row are formed by an exclusive-OR circuit. An exclusive-OR circuit offers an attractive implementation of an inverter with the associated switch in a row.

A further embodiment of an integrated semiconductor circuit in accordance with the invention is characterized in that the column selection means also receive the address signal during operation. Using the same address signal, a memory cell can be selected from the first or from the second group of memory cells.

Another embodiment of an integrated semiconductor circuit, comprising controllable precharge means for charging and discharging the outputs of the first group and for discharging and charging the outputs of the second group, respectively, in accordance with the invention, is characterized in that the semiconductor circuit also comprises controllable sampling means for coupling the memory cells to a supply terminal, the precharge means and the sampling means being activated in phase opposition during operation. Because the precharge means and the sampling means are activated in phase opposition, any short-circuit currents from a first to a second power supply terminal, via the memory cells, are thus prevented during precharging. Consequently, leakage currents, if any, will be small and the current consumption of an integrated semiconductor circuit in accordance with the invention will be low.

BRIEF DESCRIPTION OF THE DRAWING

The invention will be described in detail hereinafter with reference to the embodiments shown in the drawing; in which.

DESCRIPTION OF THE PREFERRED EMBODIMENTS

Figure 1:
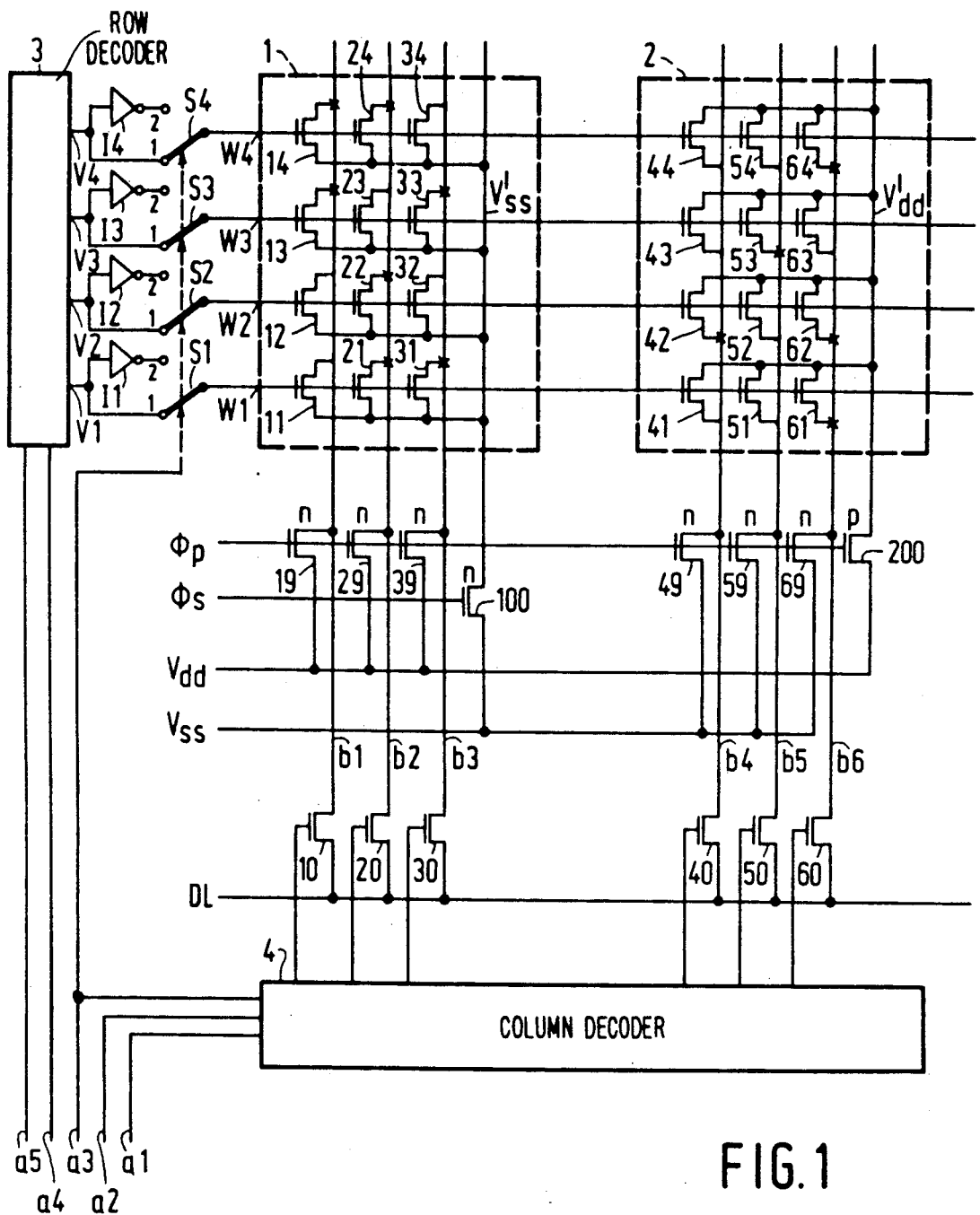
FIG. 1 shows an embodiment of a ROM (read-only memory) in accordance with the invention.

FIG. 1 shows an embodiment of an integrated semiconductor circuit in accordance with the invention. The semiconductor circuit comprises a first block of ROM cells 1 and a second block of ROM cells 2. The first block 1 comprises transistors 11 to 14, 21 to 24, and 31 to 34, all of which are of the NMOS type. The second block 2 comprises transistors 41 to 44, 51 to 54, and 61 to 64, all of which are of the PMOS type. The semiconductor circuit furthermore comprises a row decoder 3, a column decoder 4, four inverters I1 to I4, four switches S1 to S4, six precharge transistors 19, 29, 39, 49, 59 and 69 which are all of the NMOS type, two sample transistors 100 and 200 of the NMOS type and the PMOS type, respectively, and six column selection transistors 10, 20, 30, 40, 50 and 60, all of which are of the NMOS type. The word line W1 is connected to the gate electrodes of the transistors 11, 21, 31 and 41, 51, 61, which transistors are arranged in one and the same row. The word line W2 is connected to the gate electrodes of the transistors 12, 22, 32 and the transistors 42, 52, 62. The word line W3 is connected to the gate electrodes of the transistors 13, 23, 33, and 43, 53, 63, and the word line W4 is connected to the gate electrodes of the transistors 14, 24, 34 and 44, 54, 64. Output lines V1, V2, V3 and V4 of the row decoder 3 are connected, via respective switches S1, S2, S3 and S4, to the word lines W1, W2, W3 and W4, respectively. The output lines V1, V2, V3 and V4 of the row decoder 3 are connected to the respective word lines W1, W2, W3 and W4 either directly (position 1 of the switches S1 to S4) or via respective inverters I1, I2, I3 and I4 (position 2 of the switches S1 to S4). The switches S1 to S4 are controlled by an address signal a3. The row decoder 3 receives address signals a4 and a5; the column decoder 4 receives address signals a1, a2 and a3. The sources of the NMOS-transistors 11 to 14, the sources of the NMOS-transistors 21 to 24, and the sources of the NMOS-transistors 31 to 34 are connected to a supply lead V'$_{SS}$ which is coupled to a second supply terminal V$_{SS}$ via an NMOS switching transistor 100. The gate of the switching transistor 100 receives a sample signal $\phi_S$. The sources of the transistors 41 to 44, the sources of the transistors 51 to 54, and the sources of the transistors 61 to 64 are connected to a supply lead V'$_{DD}$ which is coupled to a first supply terminal V$_{DD}$ via a PMOS switching transistor 200. The gate of the switching transistor 200 receives a precharge signal $\phi_p$. Bit lines b1, b2 and b3 are coupled, via respective precharge transistors 19, 29 and 39, to the first supply terminal V$_{DD}$, said precharge transistors 19, 29 and 39 receiving a precharge signal $\phi_p$. Bit lines b4, b5 and b6 are coupled, via respective precharge transistors 49, 59 and 69, to the second supply terminal V$_{SS}$, said precharge transistors receiving a precharge signal $\phi_p$. The bit lines b1, b2, b3, b4, b5 and b6 are connected, via respective transistors 10, 20, 30, 40, 50 and 60, to a common data line DL. The gates of the transistors 10, 20, 30, 40, 50 and 60 receive selection signals from the column decoder 4. Depending on the programmed information in a memory cell in the block 1 or the block 2, the drain of a transistor in the block 1 or the block 2 is connected to the relevant bit line or not. The drain of, for example, the transistors 13 and 14 in FIG. 1 is connected to the bit line b1, as indicated by a cross at the area of the drain and the bit line. The drain of, for example the transistors 11 and 12 is not connected to the bit line b1.

Figure 2:
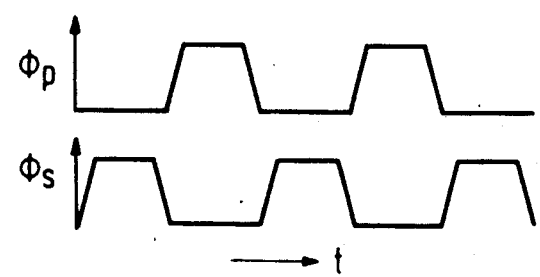
FIG. 2 shows a voltage/time diagram of two signals occurring in the circuit shown in FIG. 1.

The operation of the circuit shown in FIG. 1 will be described hereinafter with reference to the voltage-/time diagram shown in FIG. 2.

By way of example, first the reading of the information of a memory cell in the block 1 will be described, and subsequently the reading of a memory cell in the block 2.

The reading of the transistor cell 22 will be described by way of example.

Before a memory (transistor) cell in the block 1 or the block 2 is read, the bit lines b1 to b6 are precharged, i.e. the bit lines b1, b2 and b3 are charged, using the transistors 19, 29 and 39 and a logic high precharge signal $\phi_p$, to a value equal to or approximately equal to the positive supply voltage V$_{DD}$ minus a threshold voltage of the transistors 19, 29 and 39. The bit lines b4, b5 and b6 are discharged, using the transistors 49, 59 and 69 and the logic high precharge signal $\phi_p$, to a value equal to or approximately equal to the supply voltage V$_{SS}$.

The row decoder 3 and the column decoder 4 are known types. For the row decoder 3 this means that for the selection of an output line, this output line carries a logic high voltage, the other output lines carrying a logic low voltage. The same is applicable to the column decoder 4, i.e. only a single transistor of the transistors 10, 20, 30, 40, 50 and 60 is selected by means of a logic high signal.

For the selection of the NMOS-transistor cell 22, after precharging, therefore, the output line V2 is logic high and the other output lines V1, V3 and V4 are logic low. The switches S1 to S4 are all in the position 1 upon selection of a cell in the block 1, said switches being controlled by the address signal a3. The address signal a3 is also applied to the column decoder 4 so that the column decoder 4 selects, under the control of the logic signal a3, either one of the transistors 10, 20 and 30 or one of the transistors 40, 50 and 60. Upon selection of the transistor 22 in the block 1, the column decoder 4 also selects the transistor 20. Because the sample transistor 100 is driven by means of a logic high sample signal $\phi_S$ during the reading of the transistor 22 (after precharging), as is shown in FIG. 2, the source of the transistor 22 is connected to the supply terminal V$_{SS}$. Because the drain of the transistor 22 is connected to the bit line b2, denoted by a cross in FIG. 1, the bit line b2 which was positively precharged is discharged by the transistor 22 and assumes a logic low level. Because the transistor 20 is also selected, the data line DL also assumes a logic low level. However, upon selection of a transistor in the block 1 whose drain is not connected to the relevant bit line (for example, the transistor 23), the data line DL will assume a logic high value because of the fact that the relevant (precharged) bit line is not discharged.

The following takes place for the selection of a PMOS-transistor cell in the block 2. Before the selection of a transistor cell, the bit lines b4, b5 and b6 are fully or almost fully discharged by means of the precharge transistors 49, 59 and 69 and a logic high precharge signal $\phi_p$, as has already been described. In the presence of a subsequently logic low precharge signal $\phi_p$, the PMOS-transistor 200 is turned on, so that the sources of all transistors in the block 2 receive the positive supply voltage. After presentation of the correct address signals a4 and a5 for selecting, for example, the PMOS-transistor cell 52, the output line V2 assumes a logic high level and the output lines V1, V3 and V4 assume a logic low level. The switches S1 to S4 occupy the position 2 under the influence of the address signal a3 for selection of a transistor cell in the block 2. As a result, the signals on the output lines V1 to V4 are inverted and applied to the word lines W1 to W4, respectively. Consequently, the word lines W1, W3 and W4 are logic high and the word line W2 is logic low, so that only the PMOS-transistor cells 42, 52 and 62 in the block 2 are selected. Because the drain connection of the PMOS-transistor cell 52 is not connected to the bit line b5, represented in FIG. 1 by the absence of a cross at the area of the drain and the corresponding bit line, the transistor 52 does not conduct a current and the bit line b4 is not charged. On the basis of the address signals a1 to a3, the transistor 50 is selected by the column decoder 4, so that the bit line b5 is connected to the data line DL. Consequently, the level on the data line DL is logic low.

If the transistor cell 53 were selected instead of the transistor cell 52 in the above example, the bit line b5 would be charged because of the connection of the drain of the transistor cell 53 to the bit line b5 (denoted by a cross in FIG. 1). The data line DL would then assume a logic high level.

Because the precharging and sampling of the bit lines b in the circuit shown in FIG. 1 takes place in phase opposition, short-circuit currents from the supply terminal $V_{DD}$ to the supply terminal $V_{SS}$ via either NMOS memory cells in the block 1 or PMOS memory cells in the block 2 are precluded, so that the current consumption of the circuit in accordance with the invention is low.

The function of one or more of the inverters I1 to I4 and the associated switches S1 to S4 can be realised, for example, simply by way of an exclusive-OR circuit. The signal on an output line V (V1, V2, V3 or V4) and the address signal a3 in that case form the input signals, and the signal on the associated word line W (W1, W2, W3 or W4) forms the output signal of the exclusive-OR circuit.

To those skilled in the art it will be evident that the embodiment of an ROM memory in accordance with the invention as shown in FIG. 1 is only one of the many feasible embodiments. The ROM memory shown, being subdivided into 4 rows and 6 columns, serves merely to illustrate the operation of the circuit. The number of rows and columns in a circuit in accordance with the invention may be arbitrary. It will be evident that a circuit in accordance with the invention can also be used, as opposed to the circuit shown in FIG. 1, for the simultaneous selection of one or more memory cells which are disposed in the same row of the circuit. To achieve this, the relevant bit lines should be connected to separate data lines DL1, DL2, etc. so that memory information can be read in parallel.

We claim:

1. An integrated semiconductor circuit of the master slice or gate array type, comprising memory cells arranged in rows and columns and which are of the read-only type, said memory cells being subdivided into a first and a second group, which first and second groups comprise transistors of a first and a second conductivity type, respectively, column selection means for selecting, in response to a column selection signal, an output of either the first or the second group, wherein inputs of the first and the second group of memory cells in one and the same row are interconnected for the reception of a common row selection signal, and row selection means for selecting a single row of memory cells of either the first or the second group of memory cells.

2. An integrated semiconductor circuit as claimed in claim 1, wherein for each row the row selection means comprise an inverter and a switching element for presenting either an inverted or a non-inverted common row selection signal in dependence on an address signal.

3. An integrated semiconductor circuit as claimed in claim 2, wherein the inverter and the switching element in a row comprise an exclusive-OR circuit.

4. An integrated semiconductor circuit as claimed in claim 2 wherein the column selection means also receive the address signal during operation.

5. An integrated semiconductor circuit as claimed in claim 1 comprising: controllable precharge means for charging and discharging the outputs of the first group and for discharging and charging the outputs of the second group, respectively, wherein the semiconductor circuit also comprises controllable sampling means for coupling the memory cells to a supply terminal, the precharge means and the sampling means being activated in phase opposition during operation.

6. An integrated semiconductor circuit as claimed in claim 2 comprising: controllable precharge means for charging and discharging the outputs of the first group and for discharging and charging the outputs of the second group, respectively, wherein the semiconductor circuit also comprises controllable sampling means for coupling the memory cells to a supply terminal, the precharge means and the sampling means being activated in phase opposition during operation.

7. An integrated semiconductor circuit as claimed in claim 4 comprising: controllable precharge means for charging and discharging the outputs of the first group and for discharging and charging the outputs of the second group, respectively, wherein the semiconductor circuit also comprises controllable sampling means for coupling the memory cells to a supply terminal, the precharge means and the sampling means being activated in phase opposition during operation.

8. An integrated semiconductor circuit as claimed in claim 1 further comprising means for supplying an address signal to both the column selection means and the row selection means and wherein said column selection signal is a part of said address signal.

9. An integrated semiconductor circuit as claimed in claim 1 further comprising first and second controlled switching means for selectively coupling the transistors of said first and second groups of memory cells to first and second supply voltage terminals, respectively, and means for selectively closing said first and second switching means in mutually exclusive time intervals.

* * * * *